(12) United States Patent
Coolidge et al.

(10) Patent No.: US 7,667,353 B2
(45) Date of Patent: Feb. 23, 2010

(54) REMOTE ELECTRICAL DEVICE SWITCHING CONTROL, AND STATUS MONITORING AND REPORTING SYSTEM

(76) Inventors: Aaron Coolidge, 27 Christie Way, Apt. 63C, Marlborough, MA (US) 01752; Harold I. Marsden, 8 Mathieu Dr., Westborough, MA (US) 01581

( * ) Notice: Subject to any disclaimer, the term of this patent is extended or adjusted under 35 U.S.C. 154(b) by 336 days.

(21) Appl. No.: 11/755,251

(22) Filed: May 30, 2007

(65) Prior Publication Data
US 2008/0010549 A1    Jan. 10, 2008

Related U.S. Application Data (60) Provisional application No. 60/803,396, filed on May 30, 2006.

(51) Int. Cl.
*H02B 1/24* (2006.01)
(52) U.S. Cl. ...................................... 307/127
(58) Field of Classification Search ................. 307/115, 307/127; 700/286, 297; 702/57
See application file for complete search history.

(56) References Cited

U.S. PATENT DOCUMENTS

| | | | |
|---|---|---|---|
| 5,646,512 | A | 7/1997 | Beckwith |
| 6,018,449 | A | 1/2000 | Nelson et al. |
| 6,111,735 | A | 8/2000 | Nelson et al. |
| 6,114,778 | A | 9/2000 | Rostron et al. |
| 6,243,244 | B1 | 6/2001 | Nelson et al. |
| 6,347,027 | B1 | 2/2002 | Nelson et al. |
| 6,697,240 | B2 | 2/2004 | Nelson et al. |
| 6,753,792 | B2 | 6/2004 | Beckwith |
| 7,054,173 | B2 | 5/2006 | Rayner et al. |
| 7,095,597 | B1 | 8/2006 | Cousineau et al. |

(Continued)

OTHER PUBLICATIONS

Fisher Pierce, Product Brochure for AutoCap: Adaptive Capacitor Controller-Recorder With Two-Way Communications, 6 pages, 2000.

(Continued)

*Primary Examiner*—Albert W Paladini
*Assistant Examiner*—Carlos Amaya
(74) *Attorney, Agent, or Firm*—Brian M. Dingman; Mirick, O'Connell, DeMallie & Lougee, LLP (57) ABSTRACT

A capacitor bank status monitoring, control and reporting system for use with a capacitor bank with "wye"-connected capacitors having a common neutral confluence and that can be switched in and out of a multi-phase high-voltage power distribution system. There is a first sensing device that detects the current flowing between the common neutral confluence of the capacitors and a common neutral wire of the distribution system and a second sensing device that detects the voltage of at least one sensed phase of the distribution system. There is an electrical device that controls the switched state of at least one of the capacitors. There is a controller, responsive to the first and second sensing devices, for providing reporting information concerning the status of the capacitor bank and concerning the determined voltage. A wireless communications system transmits the reporting information to a remote location, and receives information from the remote location and provides it to the controller.

20 Claims, 8 Drawing Sheets

U.S. PATENT DOCUMENTS

2002/0064010 A1    5/2002    Nelson et al.
2003/0110302 A1    6/2003    Hodges et al.

OTHER PUBLICATIONS

Fisher Pierce, Product Brochure for AutoCap: Adaptive Capacitor Controller and Recorder, 6 pages, 1999.

Fisher Pierce, Product Brochure for Auto Cap: AC100 Programmable Capacitor Control, 2 pages, Jan. 2005.

Brochure for Cannon Technologies, Yukon Integrated Software for Advanced Energy Services, 2 pages.

Transmission Distribution World: KCP&L Extends Automation To Its Rural 34-kV System, Webpage, http://tdworld.com/substations/power_kcpl_extends_automation, 5 pages, Feb. 1, 2005.

Telemetric Wireless Telemetry Solutions, Datasheet for TC012 MicroRTU: Capacitor Bank Monitor and Control, 2 pages, Oct. 2002.

Telemetric Wireless Telemetry Solutions, Technical Specification for TC012 MicroRTU Capacitor Bank Monitor and Control, 5 pages, Apr. 2002.

Telemtric, Remote Monitoring and Control, Users' Guide for TC012 MicroRTU: Capacitor Bank Monitor and Control, 44 pages, Sep. 8, 2003.

Power Systems Integrity, Inc.

| CCAM # 2020 | Pole # Demo Pole | Circuit: None | |
|---|---|---|---|
| kV: 13.2 | kVAR: 1200 (6x200 cans) | Location: Demo, #1 | |
| Setpoints Downloaded: 05-09-2006 17:20:30 | Cap On Volts: 126.0 Volts | Bandwidth: 3.0 Volts | Op. delay: 30 Seconds |

Show the last 10 messages of type All Messages  [Go!]  [Return to Selection Screen]

[Show Setpoint Data]  [Edit Setpoints]  [Control CCAM]

Fig. 4A

| CCAM # | 2020 | The CCAM Location is shown above. |
|---|---|---|
| Received from CCAM | 05-09-2006 17:20:30 | This is a acknowledge of a setpoint change. |
| Control Setpoints | Used for Automatic operation | |
| Capacitor On Volts | 126.0 Volts | The cap switches on when the voltage drops below this. |
| Bandwidth Volts | 3.0 Volts | The cap switches off when the voltage rises above this + On Volts. |
| Switch Delay | 30 Seconds | This is the delay before switching. |
| Automatic Mode | Auto+Remote | This controls whether the CCAM will switch Automatically, by Remote control, or both. |
| Capacitor Status Setpoints | These are used to determine if the capacitor is on, off, or needs attention. | |
| Capacitor Off Current | 2.00 Amps | Neutral current below this value shows the capacitor is OFF or TRIPPED. |
| Capacitor Fault Current | 12.00 Amps | Neutral current between Off and Fault shows the capacitor is ON or CLOSED. Neutral current above this value shows the capacitor needs attention. |
| Capacitor Status Delay | 10 Seconds | The delay before a capacitor status change is recognized. |
| Voltage Status Setpoints | These are used to determine the if the voltage is within tolerance. | |
| Voltage Fail | 60.0 Volts | Below this the voltage is assumed to have failed. |
| Voltage Low | 118.0 Volts | Between Fail and this voltage, the voltage is low. |
| Voltage High | 138.0 Volts | Between Low and this the voltage is OK. Above this the voltage is High. |
| Voltage Status Delay | 10 Seconds | The delay before a voltage status change is recognized. |
| General Information | Other important setpoints and information. | |
| Time Between Automatic Updates | 120 Minutes | Time between automatic updates of line volts, cap current, etc. Status changes are always sent immediately. |
| Setpoints Status | OK | The setpoints are properly stored. |

Switch to Standard View

Fig. 4B

Send a command  No Command
Command Duration in Minutes (if overriding Automatic Mode) 60
Password ____________  Send Command (Click only once!)

Recent Command Requests

| Date/Time EDT | Command | Override Duration | Result |
|---|---|---|---|
| 05-04-2006 11:05:15 | Close | 60 Minutes | Command Sent |
| 05-04-2006 10:44:08 | Trip | 10 Minutes | Command Sent |
| 05-03-2006 12:38:27 | Trip | 12 Minutes | Rejected, No Command Pending |
| 05-03-2006 12:21:16 | Cancel Override | --- | Command Sent |
| 05-03-2006 12:18:37 | Trip | 5 Minutes | Command Sent |
| 05-02-2006 22:19:52 | Close | 15 Minutes | Rejected, Not in Auto Mode |
| 05-02-2006 21:25:50 | Trip | 10 Minutes | Command Sent |
| 05-02-2006 21:10:35 | Trip | 10 Minutes | Command Sent |
| 05-02-2006 18:39:11 | Cancel Override | --- | Command Sent |
| 05-02-2006 18:35:44 | Close | 12 Minutes | Rejected, Command Already Pending |

REMOTE ELECTRICAL DEVICE SWITCHING CONTROL, AND STATUS MONITORING AND REPORTING SYSTEM

CROSS-REFERENCE TO RELATED APPLICATION

This application claims priority of Provisional application Ser. No. 60/803,396, filed on May 30, 2006, the disclosure of which is incorporated herein by reference.

FIELD OF THE INVENTION

This invention relates to a remote electrical device switching control, and status monitoring and reporting system.

BACKGROUND OF THE INVENTION

Banks of capacitors are switched into and out of three phase power distribution systems for voltage and power factor correction purposes and the like, as is well known in the art. The capacitor banks typically comprise a fuse, a switch, and a capacitor for each phase. In one configuration, the three capacitors are connected in a shunt or "wye" configuration with a common neutral/ground lead.

It is desirable for the utility to both control and know the state of the capacitor bank. It is also desirable for the utility to have information regarding the operational health of the capacitor bank components. To date, such control is typically accomplished locally, and such information is typically gathered locally by field crews that periodically manually inspect the components of the capacitor bank.

Other electrical and electronic devices that are powered through the power grid, such as pad-mounted air conditioners, motor-operated switches, and circuit sectionalizers also need to be controlled and monitored.

SUMMARY OF THE INVENTION

One aspect of the invention comprises a system that monitors and reports both the state and health of a capacitor bank. The system includes a wireless communications capability that allows the capacitor bank to be monitored and controlled by an operator at a remote location. The wireless communications system per se, in the context of an electrical/electronic device connected to the power grid, is also part of the invention. Another aspect of the invention comprises remote control of capacitor banks, and/or other electrical/electronic devices connected to the power grid such as air conditioners. Yet another aspect comprises determination and control of the VAR of the distribution system.

This invention features a capacitor bank status monitoring, control and reporting system for use with a capacitor bank with "wye"-connected capacitors having a common neutral confluence and that can be switched in and out of a multi-phase high-voltage power distribution system. There is a first sensing device that detects the current flowing between the common neutral confluence of the capacitors and a common neutral wire of the distribution system and a second sensing device that detects the voltage of at least one sensed phase of the distribution system. There is an electrical device that controls the switched state of at least one of the capacitors. There is a controller, responsive to the first and second sensing devices, for providing reporting information concerning the status of the capacitor bank and concerning the determined voltage. A wireless communications system transmits the reporting information to a remote location, and receives information from the remote location and provides it to the controller.

The first sensor may comprise a transformer and an electronic device that determines a current level based on an input voltage. The second sensor may comprise a transformer. The second sensor may detect voltage and current of the sensed phase. The controller may determine the Volt-Amp-Reactive (VAR) state of the sensed phase. The controller may control the switched state of the capacitor for a phase based on the determined VAR state. The capacitor may be switched in when the VAR is below a threshold value and switched out when the VAR is above a threshold value.

The capacitor bank status monitoring, control and reporting system may further include a local manual control for controlling the capacitor switched state. The local control may comprise a pendant. The capacitor bank status monitoring, control and reporting system may further include a switching control for controlling the capacitor switched state. The capacitor switched state may be based on the voltage of a phase, wherein the capacitor is switched in when the voltage is below a threshold value and is switched out when the voltage is above a threshold value. The monitoring and control functions may be separate such that if one fails the other can still work.

BRIEF DESCRIPTION OF THE DRAWINGS

Other objects, features and advantages will occur to those skilled in the art from the following detailed description of the invention, and the accompanying drawings, in which.

DETAILED DESCRIPTION OF THE INVENTION

Figure 1:
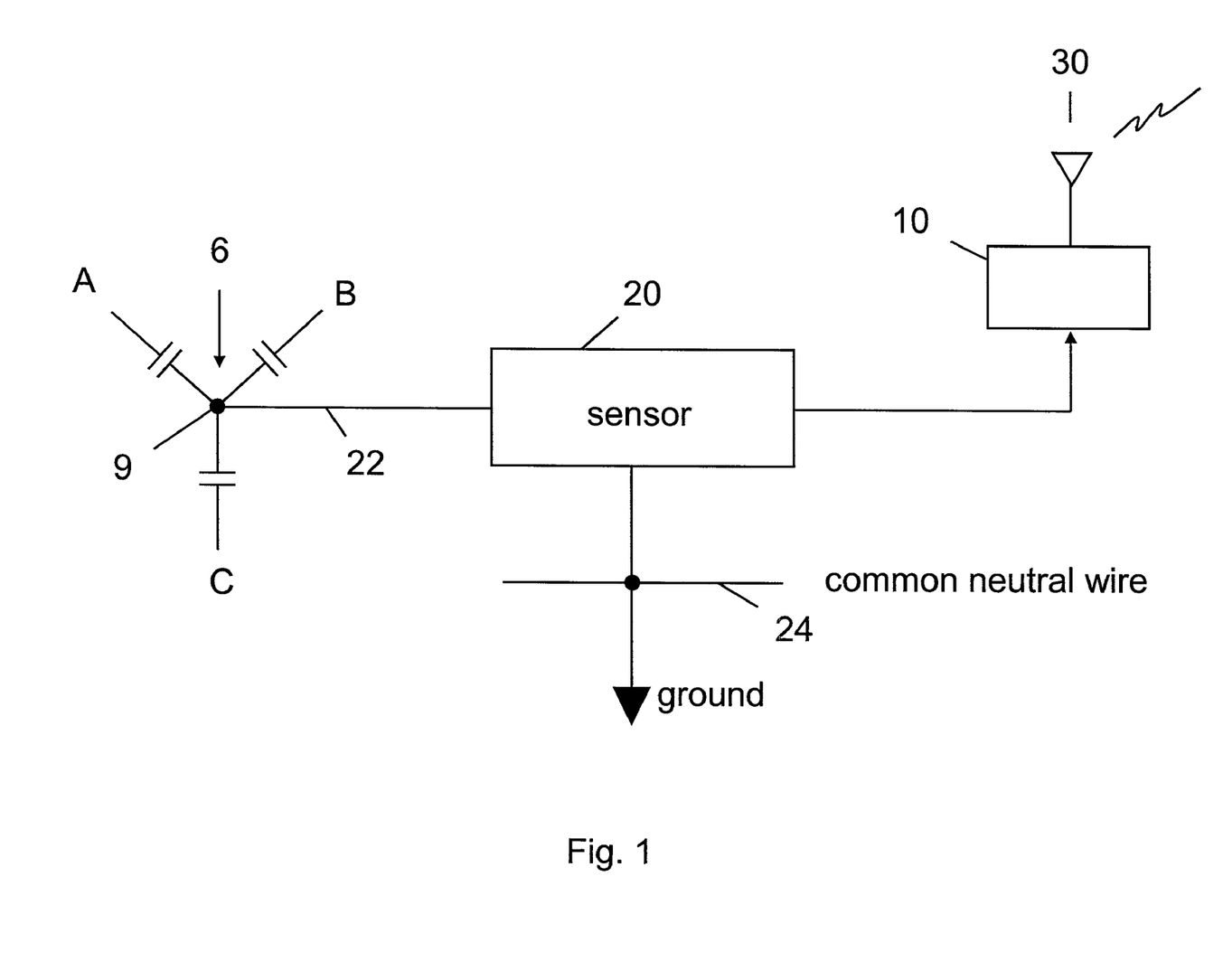
FIG. 1 is a schematic diagram of an embodiment of the invention for a "wye"-connected capacitor bank.
Figure 2:
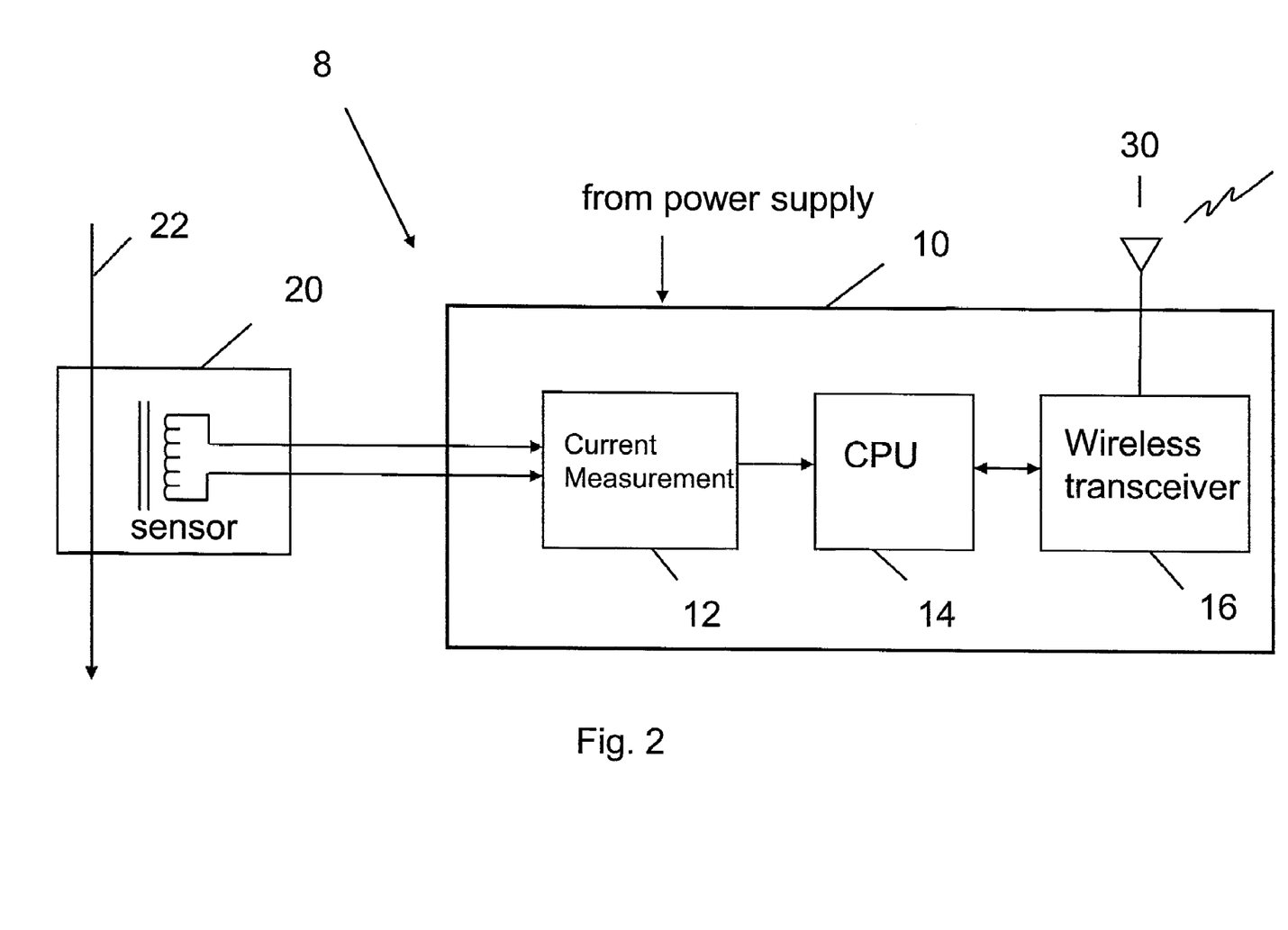
FIG. 2 is a more detailed schematic diagram of the current sensor and electronics module of the embodiment of FIG. 1.

One preferred embodiment of the monitoring and reporting system aspect of the invention is shown in FIGS. 1 and 2. FIG. 1 schematically depicts a "wye"-connected capacitor bank 6 comprising three capacitors, one for each of the three phases, A, B and C. In this capacitor bank configuration, wire 22 runs from the neutral confluence 9 of the three capacitors to ground. This neutral/ground lead 22 is typically connected to common neutral wire 24 that is part of the existing power distribution system. Wire 22 then runs to ground.

In this aspect of the invention, the current flowing through wire 22 between capacitor common point 9 and neutral wire 24 is measured. The value of the current is a measure of the state of the capacitor bank; when the capacitors are switched out, the current has a relatively low value, when they are switched in, the current is in a middle range value, and if there is a malfunction such as a malfunction in a switch, fuse and/or capacitor, the current has a still higher value.

As shown in FIG. 2, inventive monitoring and reporting system 8 includes sensor 20 that senses the current on line 22 between confluence 9 of the capacitors and common neutral wire 24. Electronics module 10 is also part of inventive system 8. The signal from sensor 20 is provided to current measurement device 12, which preferably comprises an Analog Devices model number 7758 chip that outputs the value of the current from the input voltage value. The current value is continuously provided to CPU 14, which can be programmed with the cut off values or set points for the three operational ranges discussed above.

Wireless transceiver 16 and antenna 30 accomplish a bidirectional data transmission network that preferably communicates over the cellular telephone network with a centralized monitoring and control location, not shown in the drawings. The bidirectional capability of the communication network allows a remote operator to change the set points in CPU 14, or request the current capacitor bank status from CPU 14, for example. The bidirectional communication preferably takes place using SMS messages. Databases at each end contain information that is sufficient to allow the CPU to interpret a message and output an appropriate signal such as a message or command, for example. The use of SMS messaging is a simple, low-cost means available in any location with cellular coverage, without the need to use expensive two-way radio or paging network connections.

Module 10 is preferably powered by the 120-volt power supply that is present on the utility pole for powering the capacitor bank controller in use at the pole. A battery backup, or other type of energy storage such as a high energy density capacitor (not shown in FIG. 2) may also be provided in module 10 so that the device can operate in case of a power failure. As the 120 volt power supply will be lost in case of a power outage, such would be recognized and communicated by system 8. System 8 thus can help a remote operator to determine both the existence and extent (through multiple system 8 installations located across the power grid) of a power outage.

Figure 3:
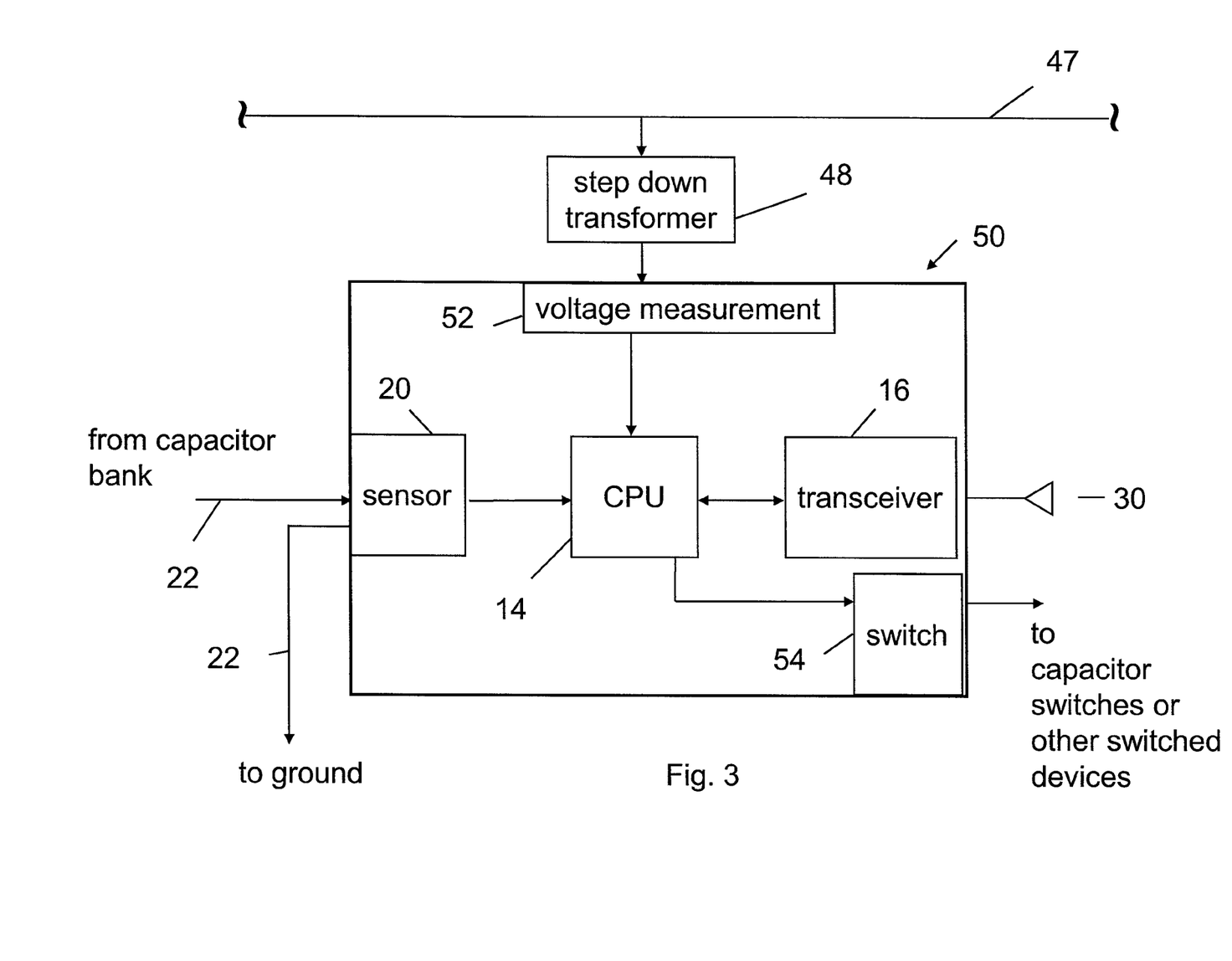
FIG. 3 is a schematic diagram of an alternative embodiment that also detects line voltage.

Another embodiment of the invention is shown in FIG. 3. Module 50 includes the functionality of system 8, and also includes the means to control the state of the capacitor switches. Module 50 thus allows a remote operator to cause a desired operation of the capacitor bank controller through a command received by wireless transceiver 16 and CPU 14. For example, the controller could be caused to switch one or more capacitors, or the entire capacitor bank in or out, or to interrogate the present state of the capacitor bank, or other electrical device monitored and controlled by the present system.

Module 50 determines the voltage in line 47 through step-down transformer 48 (which is normally present to provide 120V power to other devices present at the pole, such as the capacitor switches) and voltage measurement device 52. CPU 14 is programmed with the additional functionality described to accomplish capacitor control. This is accomplished by sending appropriate signals to master switching module 54, which is connected to the three existing switches for the capacitors for each phase. In embodiments in which a different electrical device, such as an air conditioner, is controlled through such switching, the output of switch 54 is provided to the device(s).

The operation of the monitoring functionality and the operation of the control functionality are preferably separate to the extent that they do not communicate with one another. As a result, if one of these functions is compromised or fails, the other can still occur. For example, if switch 54 or an external capacitor, capacitor switch or fuse fails, remote control of the capacitor state is lost. However, the monitoring functionality will still report the capacitor state. In fact, an operator can use such reported capacitor state information to diagnose the failure and dispatch a repair crew.

Figure 4A:
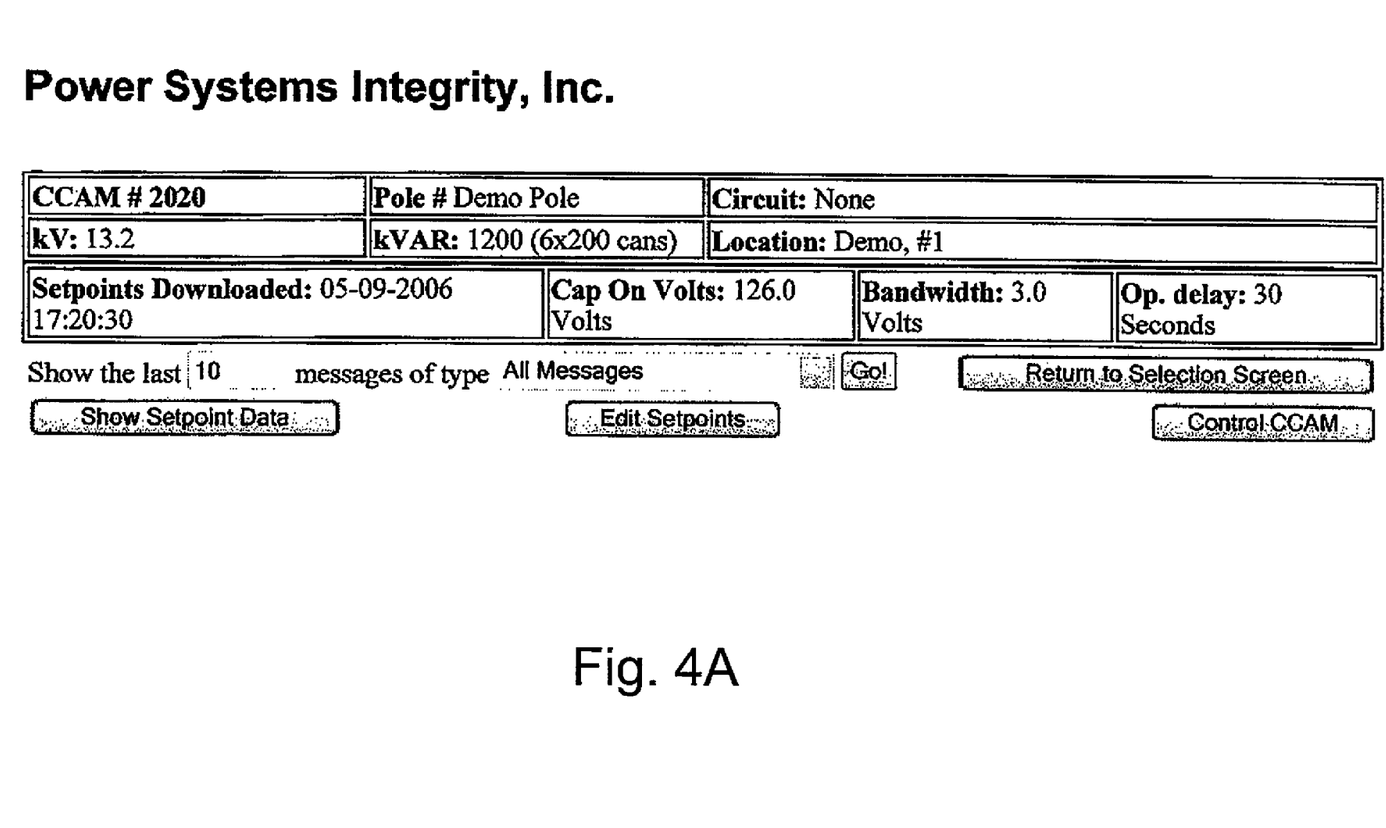
FIGS. 4A and 4B together comprise a screen shot of a variable display page for the embodiment of FIG. 3.
Figure 4B:
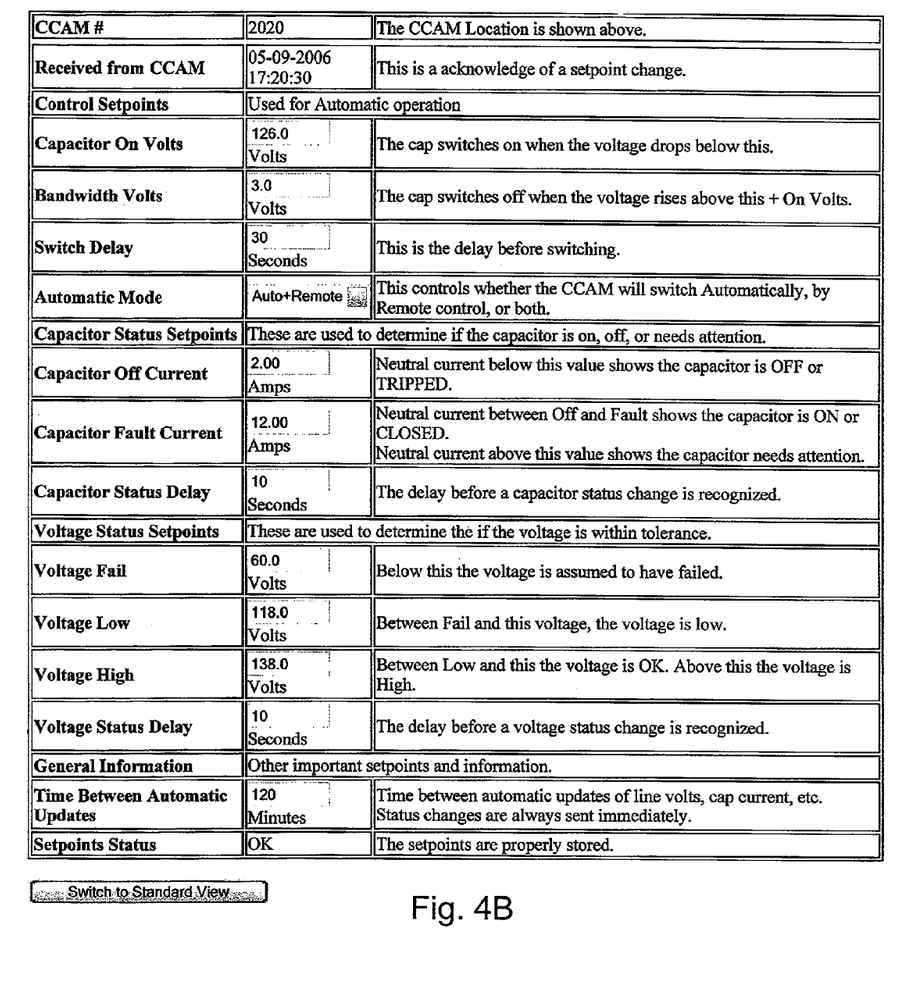

FIGS. 4A and B together detail one example of a screen shot of a variable display page for module 50. The variables can be factory pre-set, and/or set by a local or remote operator. Module 50 can thus be used by a particular utility for its particular grid and local pole-level setup. The ability to remotely change setpoints and perform certain actions such as closing or opening capacitor switches provides desirable flexibility.

Figure 5:
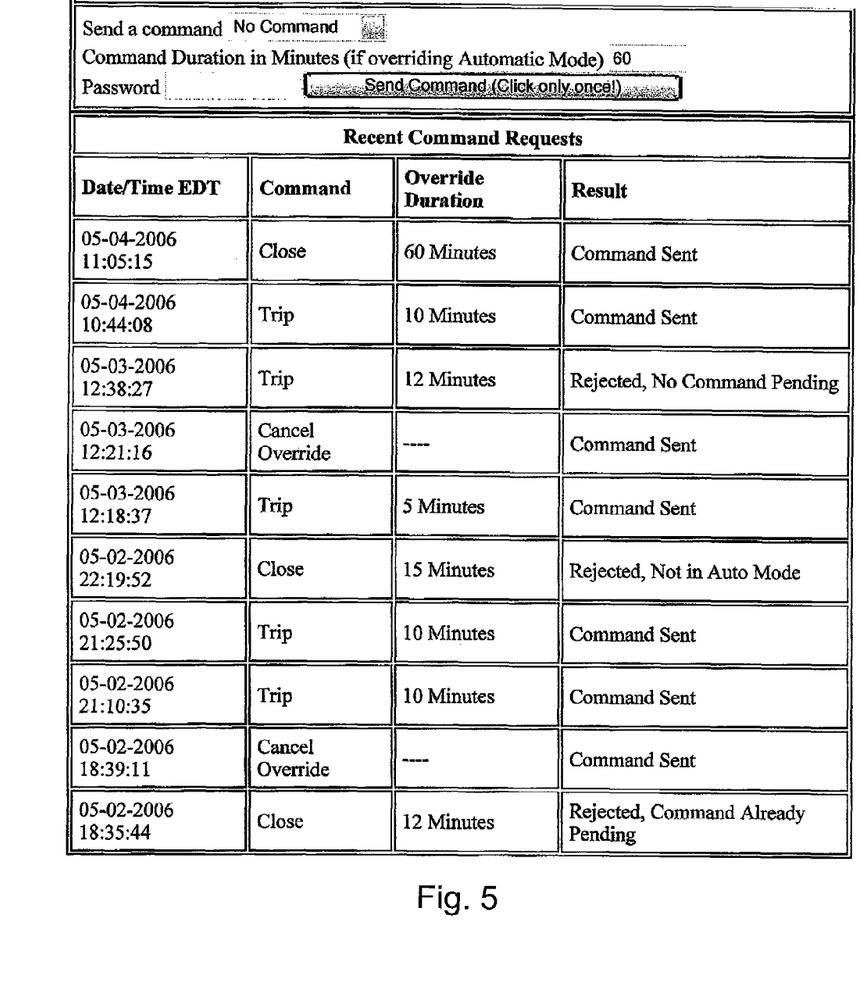
FIG. 5 is an example of a command report screen seen by the remote operator which allows the operator to monitor and review grid health and capacitor bank status as part of the invention.

FIG. 5 is an example of a command report screen seen by the remote operator which allows the operator to monitor and review grid health and capacitor bank status.

DETAILED SPECIFICATION OF MODULE 50,
FIG. 3

Remote Communications Functions:

Incorporates a built-in wireless modem for two-way communications. Initiates messages under control of the CPU when required, and receives messages and forwards them to the CPU for remote operation. System has a flexible alarm system that allows for messages to be sent based on a set of conditions, while each alarm condition may be enabled or disabled.

Monitoring Functions:

Provides a comprehensive set of monitoring functions. In every case, each setpoint used for monitoring may be altered from the local front panel user interface, over the (optional) optical communication port, or via cellular network remote control.

Capacitor Monitoring:

The neutral current of a wye connected capacitor is an indicator of capacitor status. Continuously monitors the neutral current and determines the capacitor status, which may be Tripped Out, Closed In, or Faulted. When the capacitor status changes, a message is sent over the cellular network.

Voltage Monitoring:

Continuously monitors line voltage as measured by the control transformer. If the line voltage goes outside of limits, a message is sent over the cellular network. With the optional high capacity non-battery backup power source (not shown in the drawings), will also send a message on the loss of control voltage; this feature can be integrated into outage detection systems.

Automatic Control Functions:

Provides automatic capacitor control algorithms. Each setpoint used in the switching algorithm may be altered from the front panel user interface, over the (optional) optical communication port, or via cellular remote control.

Simple Control Algorithms:

All simple control algorithms are supported, which include: 1) control by line voltage as measured from the control transformer; 2) control by ambient temperature as sensed internally (temperature sensor not shown in the drawing); 3) control by time clock which is accurately set from the cellular network.

Universal Control Algorithm:

A "Universal" switching control algorithm is also available. The Universal algorithm allows the user to select from and blend any combination of time, temperature, and voltage control. The Universal algorithm may be altered by remote control, allowing flexibility in switched capacitor automatic control.

Complex Control Algorithms:

In some cases a simple control algorithm is insufficient. The inventive system supports single or three phase VAR based control algorithms using optional external primary-voltage sensors. Together with the Universal Control Algorithm, this allows flexibility in selecting control schemes.

Remote Control Functions:

Allows remote control of the switched capacitor over the cellular network. Remote control is performed using a call-back method, wherein the authorized user is called to confirm that a request for capacitor switching has been made. This limits the possibility of unauthorized switching requests.

Local Control Functions:

Allows local control of the switched capacitor via a set of front panel toggle switches. May also be placed in Neutral mode to prevent any capacitor operations. Local operation of the capacitor is performed by switching to "Manual" control then operating the "Trip/Close" switch. An optional pendant (a remote, portable, wired switch) may be used to manually switch the capacitor from a distance. An optional time-delay before manual operation is also available.

User Interface:

An intuitive local user interface consisting of switches and an LCD panel. All of the sensed inputs are displayed serially on the LCD panel, and all of the configurable control and monitoring setpoints may be changed via the user interface.

The optional optical interface port includes Windows software that may be used to monitor the sensed inputs and to change the monitoring and control setpoints. The setpoints may be saved to a file and duplicated onto other units with minimal effort.

The remote configuration interface allows every monitoring and control setpoint to be read out, changed, and verified remotely without ever visiting the installation site.

An optional graphical LCD panel allows for the local display of waveform data and simplifies local setpoint changes.

Additional Inputs and Outputs:

Can be configured with optional inputs and outputs. Digital inputs and outputs can be used to sense and control items such as motor operated switches. Analog inputs and outputs can sense signals generated by such items as gas detectors. Serial IO can be used to add remote functions to an existing RTU (remote terminal unit).

Mechanicals:

Housed in a self-extinguishing NEMA 4xUV stabilized outdoor enclosure. A standard meter base attachment is provided, with customer-specified number of jaws and wiring to enable any capacitor control to be directly replaced. The enclosure door is provided with a tool-less latch and is capable of being sealed with a standard meter type tamper-evident seal. Mounts to the meter base using a standard meter ring.

Standard Specifications:

Operating Voltage Input: 60 to 140 VAC, single phase. Normally supplied from the control transformer.

Operating Temperature Range: −40 to +70 C.

Output Switching Capacity: 15 Amps, 125 VAC, inductive rated.

System Fuse: Type FLM, 10,000 Amp Interrupt Rating

Voltage Sensing Input: 0 to 140 VAC, 0.01 volt resolution, 0.5% accuracy.

Current Sensing Input: 0 to 120 AAC, 0.01 amp resolution, 0.5% accuracy, auto ranging.

Meter Base Interface: Specify number of jaws and wiring when ordering. Up to 11 jaws can be accommodated.

Control Algorithms: (All Algorithms Incorporate Voltage Override and Underride)
    S10: Voltage Control
    S11: Temperature Control
    S12: Time Clock Control
    S13: Universal Simple Control (Selectable Voltage, Temperature, Time, or Blended)
    C20: Single-Phase VAR control (requires single-phase primary voltage and current sensor)
    C21: Three-Phase VAR control (requires three-phase primary voltage and current sensor)

Cellular Provider, Specify One: (Other Networks are Available)
    N10: Compatible with the Verizon network
    N11: Compatible with the Sprint network
    N12: Compatible with the Cingular/AT&T network Optional Features:
    P10: Front Door Open Notification
    P11: Backlit LCD panel (requires option P10)
    P12: Graphical LCD panel with Waveform Displays (requires options P10 & P11)
    P13: Backup Power Source
    P15: Tamper Notification (indicates removal from meter base, requires option P13)
    P16: Optical Interface Port
    P17: Remote Pendant for Local Operation (requires option P16)
    P18: Time Delay on Local Operation
    P19: Long-Range Wireless Antenna
    P20: Isolated Digital Input, up to 4 (specify each voltage required, e.g., 125VAC)
    P21: Isolated Analog Input, up to 4 (specify each voltage required, e.g., 0-10V)
    P22: Isolated Digital Output, up to 4 (dry contact, 2 A @ 125 VAC)
    P23: Isolated Analog Output, up to 4 (specify each voltage required, e.g., 0-10V)
    P24: Isolated Serial Port (Specify RS232, RS422, or RS485, contact factory for details)
    P30: Remote Firmware Upgradeability FIGS. 6 and 7 detail another embodiment of the invention. System 100 is able to monitor, report and control the volt-amp-reactive (VAR) state of an electrical power distribution system comprising high-voltage conductors A, B and C. Each of sensors 110 is a know type of current-voltage sensor. The invention could be used with only one or two phases, but the illustration and description are for the typical application for all three phases of a three-phase power distribution system. The output of sensors 110 is typically a voltage that is proportional to the line voltage, and a current or voltage that is proportional to the line current.

Figure 6:
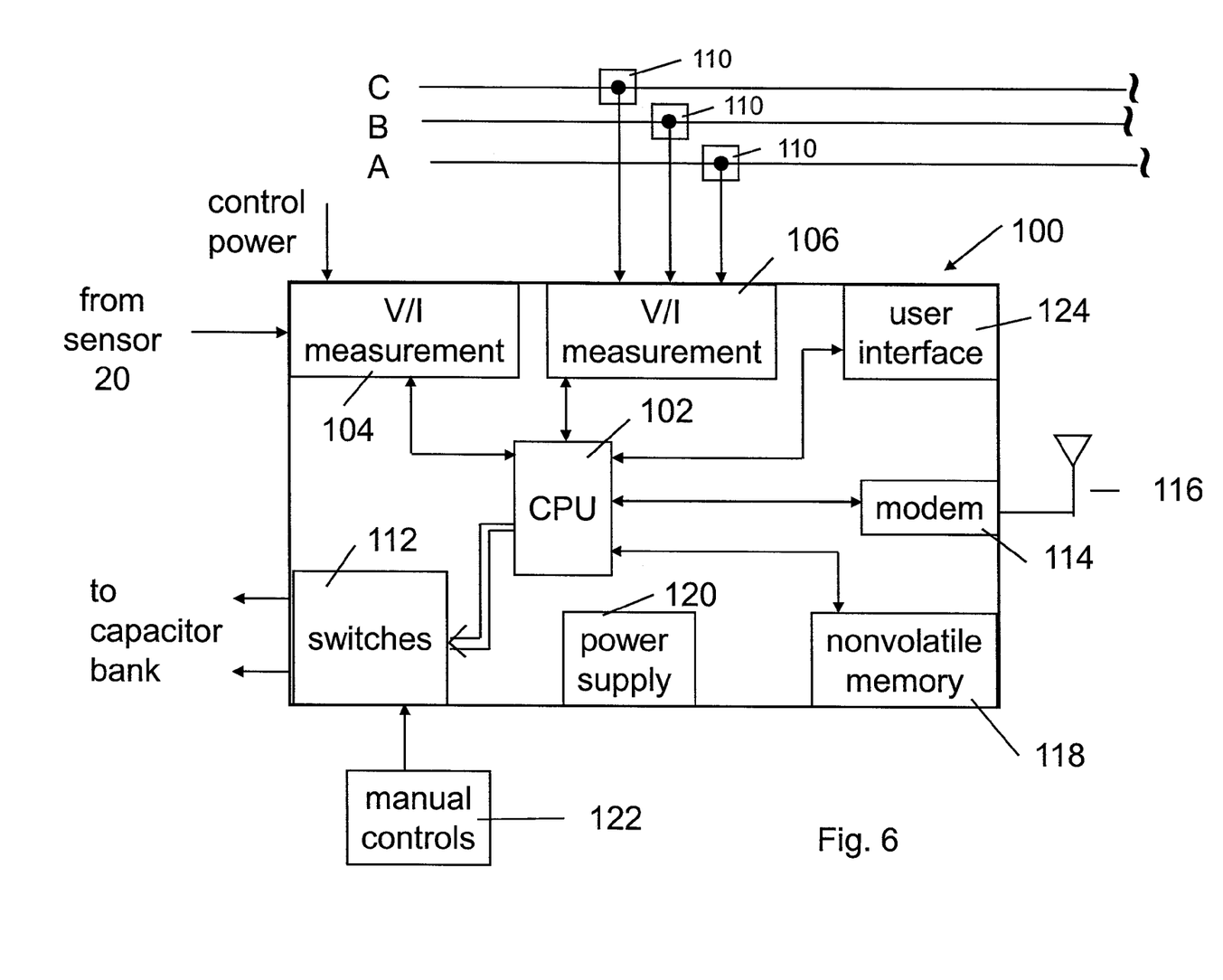
FIG. 6 is a schematic diagram of another alternative embodiment of the invention that determines and corrects the VAR of the power distribution system.

System 100 is able to monitor, report and control the VAR of one, two or all three of the distributional lines. Utilities desire to minimize VAR in order to maximize the billable power for a given amount of input power. Switching one, two or all three of the capacitors in a capacitor bank can be an effective means of controlling VAR. The use of three sensors 110 allows current, voltage and VAR to be determined individually for each phase. If fewer sensors are used, the VAR needs to be estimated on the phases that are not sensed.

System 100 includes CPU 102 that provides the communication and control signals. V/I measurement device 106 may be an Analog Devices 7758 chip. V/I measurement device 104 may be an Analog Devices 7763 chip as used in the embodiment of FIG. 3; through this device the loss of control power can be detected and reported through the CPU. The sensors and these two measurement devices provide the voltage and current on one, two or three of the phases, and the current flowing between the capacitor common point and the neutral wire. This information is sufficient to allow the determination of the VAR of each of the three phases, as well as the state of the capacitor bank, and whether a power failure has occurred. Power supply 120 provides power to the entirety of system 100. User interface 124 is a standard component, as is non-volatile memory 118. Modem 114 and antenna 116 provide for bi-directional wireless communication, typically using SMS messages as described above. Switches 112 are controlled by CPU 102 and provide control signals to close or trip the capacitor bank, as appropriate.

Figure 7:
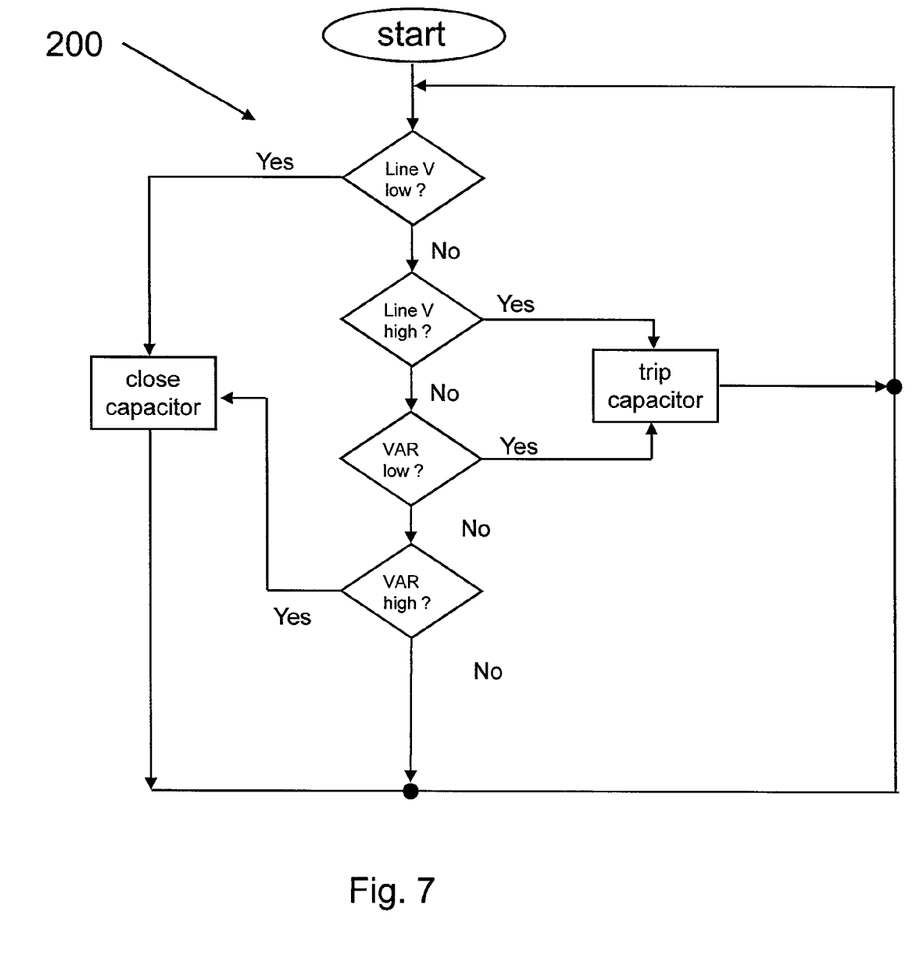
FIG. 7 is a flow chart of VAR control that can be accomplished by the embodiment of FIG. 6.

FIG. 7 details the preferred VAR control algorithm for single phase sensing. The algorithm for polyphase sensing would be similar. With polyphase sensing, the control could be configured to switch the three capacitors together or individually, as desired, to achieve an appropriate VAR control. In the algorithm, if the line voltage is low, the capacitor is closed. If the line voltage is high, the capacitor is tripped. If the VAR is low, the capacitor is tripped. If the VAR is high, the capacitor is closed.

A three-phase VAR algorithm could use as a measure the average of the three calculated VAR values or the minimum or maximum of the three VAR values or could use both, potentially with different limits. For example, if the average VAR was less than a setpoint, an action could be taken, such as tripping all the capacitors. If an individual VAR was less than a particular value, then the capacitor could be tripped, and so on. Typically, if the control system allowed for the individual switching of the capacitor for each phase, the control would be based on the voltage and VAR for that phase.

The modem allows for remote control and remote set point manipulation. Remote control also allows for a particular operation, as do local manual controls 122. For example, remote control could be used to switch one or more of the capacitors switches 112, change the limits or set points used in algorithm 200, FIG. 7, or for any other purpose as described herein.

Modem 114 allows system 100 to report to a remote operator any of the determined values, including line voltage, line current, line VAR and any other line parameters that are sensed by local sensing equipment. The system could also report the outputs of algorithm 200, or any other values as described above.

Although specific features of the invention are shown in some drawings and not others, this is for convenience only as the features may be combined in accordance with the invention. Other embodiments will occur to those skilled in the art and are within the following claims.

What is claimed is:

1. A capacitor bank status monitoring, control and reporting system for use with a capacitor bank with "wye"-connected capacitors having a common neutral confluence and that can be switched in and out of a multi-phase high-voltage power distribution system, the system comprising:

a first sensor that detects the current flowing between the common neutral confluence of the capacitors and a common neutral wire of the distribution system;

a second sensor that detects the voltage of at least one sensed phase of the distribution system;

an electrical device that controls the switched state of at least one of the capacitors;

a controller, responsive to the first and second sensors, for providing reporting information concerning the status of the capacitor bank and concerning the determined voltage; and a wireless communications system for transmitting the reporting information to a remote location, and receiving information from the remote location and providing it to the controller.

2. The capacitor bank status monitoring, control and reporting system of claim 1 in which the first sensor comprises a transformer and an electronic device that determines a current level based on an input voltage.

3. The capacitor bank status monitoring, control and reporting system of claim 1 in which the second sensor comprises a transformer.

4. The capacitor bank status monitoring, control and reporting system of claim 1 in which the second sensor detects voltage and current of the sensed phase.

5. The capacitor bank status monitoring, control and reporting system of claim 4 in which the controller determines the Volt-Amp-Reactive (VAR) state of the sensed phase.

6. The capacitor bank status monitoring, control and reporting system of claim 5 in which the controller controls the switched state of the capacitor for a phase based on the determined VAR state.

7. The capacitor bank status monitoring, control and reporting system of claim 6 in which the capacitor is switched in when the VAR is below a threshold value and is switched out when the VAR is above a threshold value.

8. The capacitor bank status monitoring, control and reporting system of claim 1 further comprising a local manual control for controlling the capacitor switched state.

9. The capacitor bank status monitoring, control and reporting system of claim 8 in which the local control comprises a pendant.

10. The capacitor bank status monitoring, control and reporting system of claim 1, further comprising a switching control for controlling the capacitor switched state.

11. The capacitor bank status monitoring, control and reporting system of claim 10 in which the capacitor switched state is based on the voltage of a phase, wherein the capacitor is switched in when the voltage is below a threshold value and is switched out when the voltage is above a threshold value.

12. The capacitor bank status monitoring, control and reporting system of claim 10 in which the monitoring and control functions are separate such that if one fails the other can still work.

13. A capacitor bank status monitoring, control and reporting system for use with a capacitor bank with "wye"-connected capacitors having a common neutral confluence and that can be switched in and out of a multi-phase high-voltage power distribution system, the system comprising:

a first sensor comprising a transformer and an electronic device that determines a current level based on an input voltage level, the first sensor detecting the current flowing between the common neutral confluence of the capacitors and a common neutral wire of the distribution system;

a second sensor that detects the voltage and current of at least one sensed phase of the distribution system;

an electrical device that controls the switched state of at least one of the capacitors;

a controller, responsive to the first and second sensors, for determining the Volt-Amp-Reactive (VAR) state of the sensed phase, and for providing reporting information concerning the status of the capacitor bank, concerning the determined voltage, and concerning the VAR state; and a wireless communications system for transmitting the reporting information to a remote location, and receiving information from the remote location and providing it to the controller.

14. The capacitor bank status monitoring, control and reporting system of claim 13 in which the controller controls the switched state of the capacitor for a phase based on the determined VAR state.

15. The capacitor bank status monitoring, control and reporting system of claim 14 in which the capacitor is switched in when the VAR is below a threshold value and is switched out when the VAR is above a threshold value.

16. The capacitor bank status monitoring, control and reporting system of claim 13 further comprising a local manual control for controlling the capacitor switched state.

17. The capacitor bank status monitoring, control and reporting system of claim 16 in which the local control comprises a pendant.

18. The capacitor bank status monitoring, control and reporting system of claim 13, further comprising a switching control for controlling the capacitor switched state.

19. The capacitor bank status monitoring, control and reporting system of claim 18 in which the capacitor switched state is based on the voltage of a phase, wherein the capacitor is switched in when the voltage is below a threshold value and is switched out when the voltage is above a threshold value.

20. The capacitor bank status monitoring, control and reporting system of claim 18 in which the monitoring and control functions are separate such that if one fails the other can still work.

* * * * *